United States Patent
Lee et al.

(10) Patent No.: US 8,084,870 B2
(45) Date of Patent: Dec. 27, 2011

(54) SEMICONDUCTOR DEVICES AND ELECTRICAL PARTS MANUFACTURING USING METAL COATED WIRES

(75) Inventors: Sangdo Lee, Jiangsu (CN); Yonksuk Kwon, Cebu (PH); Bin Cai, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 534 days.

(21) Appl. No.: 11/690,908

(22) Filed: Mar. 26, 2007

(65) Prior Publication Data

US 2007/0222042 A1 Sep. 27, 2007

Related U.S. Application Data

(60) Provisional application No. 60/786,259, filed on Mar. 27, 2006.

(51) Int. Cl.
*H01L 23/48* (2006.01)
(52) U.S. Cl. ............ 257/784; 257/684; 257/E23.025
(58) Field of Classification Search ............ 257/684, 257/E23.025
See application file for complete search history.

(56) References Cited

U.S. PATENT DOCUMENTS

| | | | |
|---|---|---|---|
| 5,608,260 A * | 3/1997 | Carper et al. | 257/666 |
| 5,772,451 A * | 6/1998 | Dozier et al. | 439/70 |
| 2001/0020545 A1 | 9/2001 | Eldridge et al. | |
| 2002/0117330 A1 | 8/2002 | Eldridge et al. | |
| 2004/0032015 A1 * | 2/2004 | Sekiguchi et al. | 257/684 |
| 2004/0245320 A1 | 12/2004 | Fukagaya et al. | |

OTHER PUBLICATIONS

Michael Quirk, Semiconductor Manufacturing Technology, Prentice Hall 2001.*

* cited by examiner

*Primary Examiner* — Marcos D. Pizarro
*Assistant Examiner* — Eva Yan Montalvo
(74) *Attorney, Agent, or Firm* — Thomas R. FitzGerald, Esq.; Hiscock & Barclay, LLP

(57) ABSTRACT

The device of this invention includes a semiconductor die attached to a bare copper lead frame and electrically coupled to a lead by a metal wire coated with a metallic material. The device would function similarly to devices where the lead frames were coated with other metallic materials, but at lower costs because instead of plating the lead frame the wire is plated. The wire can be either gold or aluminum. When the wire is gold, the coating may be silver or other suitable metallic materials. When the wire is aluminum, the coating may be nickel, palladium, or other suitable metals.

5 Claims, 3 Drawing Sheets

SEMICONDUCTOR DEVICES AND ELECTRICAL PARTS MANUFACTURING USING METAL COATED WIRES

CROSS-REFERENCE TO RELATED APPLICATIONS

This application claims the benefit of U.S. Provisional Patent Application Ser. No. 60/786,259, filed Mar. 27, 2006 which is hereby incorporated by reference.

FIELD OF THE INVENTION

This invention relates to a packaged semiconductor device, and more specifically, to a semiconductor device having a metal wire coated with a metallic material used for wire bonding and to the use of coated wires for the connection of electronic parts.

BACKGROUND OF THE INVENTION

Generally a packaged semiconductor device includes a semiconductor die attached to a copper lead frame plated with other metals, such as nickel or silver. The die is then connected to leads by bonding wires made from, generally, aluminum, gold, or copper to a wire bond site on the die and bonded on its second end to a corresponding lead. For example, an aluminum wire on its first end is bonded to a source contact on the die and its second end is bonded to a source lead. Thereafter the device is packaged leaving the leads exposed through the packaging material to connect the packaged semiconductor device to an electronic device in which it is placed.

Since copper is a relatively cheap metal, lead frames are generally made at the basic level of copper and then plated with other materials such as nickel or palladium, or even both. Nickel and palladium are known to have a reliable intermetallic connection with aluminum. Silver is also used to plate copper lead frames because this metal, too, has a reliable intermetallic connection with gold. However, Aluminum and copper, for instance, are not known to have a reliable connection. Aluminum and copper create several intermetallic phases that are brittle and that lower shear strength at certain temperatures which increase the growth of brittle copper-aluminum intermetallic phases, and thereby cause breakage in the wire or bond.

Aluminum and nickel, for instance, are a reliable metallurgic system because it is not susceptible to Kirkendall voiding or galvanic corrosion. Further, nickel and copper are resistant to sulfuric and hydrofluoric acids. Thus, it is desired in the art to produce a cost competitive product. Further, it is desired to produce a product using metals more efficiently to reduce costs while still manufacturing a device with reliable metallurgic systems.

SUMMARY OF THE INVENTION

An embodiment of the present invention comprises a semiconductor device such as a diode, MOSFET, thyristor, IGBT, and integrated circuit. The semiconductor device has one or more bond pads for receiving a bond wire. The semiconductor device in one embodiment of the present invention is a transistor with a control region, first terminal region and a second terminal region, with the second terminal region attached to a lead frame and coated wire connecting the semiconductor die from its first terminal region to a first terminal lead of the lead frame. The wires connecting the die to the lead can be either gold or aluminum and coated with a metal or alloy such as silver, in relation to the gold wire, and nickel or palladium, with respect to the aluminum wire. The wire is coated to eliminate the need for plating of the lead frame, thereby reducing costs Of manufacturing a packaged semiconductor.

Further, a method of manufacturing a semiconductor device according to the present invention includes providing a semiconductor device having a first terminal region on its first surface, providing a lead frame having a die attach pad and leads, and bonding a metal wire coated with metal or alloy to the die and a corresponding lead. In a further aspect of the present invention the bonding step comprises either ultrasonic or thermosonic bonding methods. In still further aspect of the present invention the wire is either a gold or aluminum wire which is coated with a suitable metallic wire, such as silver for a gold wire, and nickel or palladium for an aluminum wire.

An advantage of the invention is the ability to eliminate plating bare copper lead frames, and thereby significantly reduce manufacturing costs. Instead, the wire is coated with an appropriate metal.

Another advantage of the invention is that by coating the wire with metal previously used to plate the copper lead frames, there is substantially no loss of reliability in the system. In other words, the intermetallic phases remain the same because the same metals used to plate the lead frames are used to coat the aluminum wire. Thus the same metallurgic systems are in place, which are known in the art as being reliable systems, and are less prone to the problems or potential failures of other metallurgic systems, such as aluminum and copper.

BRIEF DESCRIPTION OF THE DRAWINGS

Corresponding reference characters indicate corresponding parts throughout the several views. The examples set out herein illustrate embodiments of the invention but should not be construed as limiting the scope of the invention in any manner.

DETAILED DESCRIPTION

Figure 1:
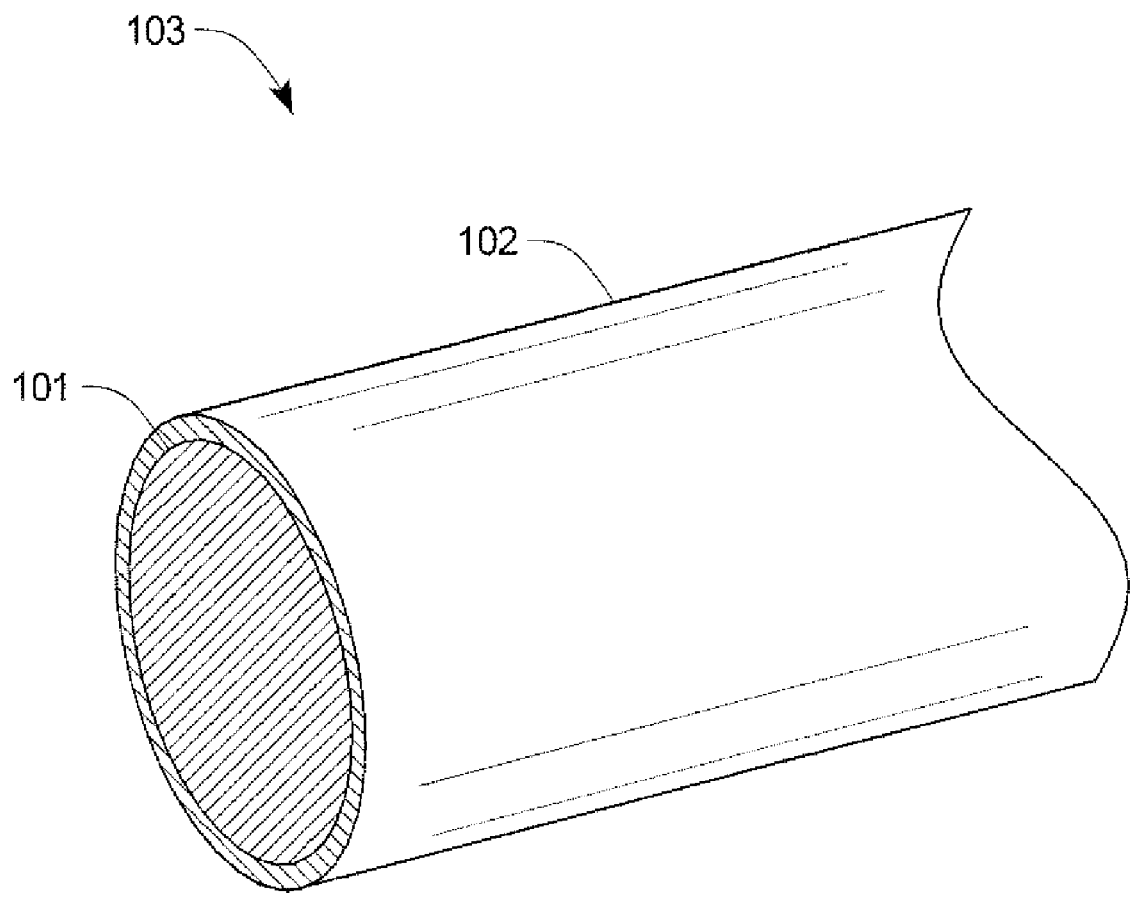
FIG. 1 is a sectional view of a coated wire according to an embodiment of the present invention.

FIG. 1 shows a coated aluminum wire 103. An aluminum wire 101 is coated with a metallic material 102, and is used for creating an electrical connection between a semiconductor die and leads during packaging of the device and is more generally used for connecting electrical parts. The wire 101 may be pure aluminum, but may also be an aluminum alloy with silicon or magnesium as a strengthening mechanism. The coating 102 may be a copper compatible metal such as nickel or palladium.

The coating 102 is plated onto the aluminum wire 101 either by electroless or electrical plating. For both processes, the aluminum wire is first prepared for plating by cleaning the surface of the wire to improve adhesion of the metal coating to the surface of the aluminum wire 101. This can be accomplished by methods known in the art, such as using detergents or solvents to remove grease, environmental contaminants, oxides and other undesirable materials that can affect the ability of the metal coating 102 to adhere to the wire 101.

With respect to electroless plating, the metal coating 102 may be applied to the wire by depositing metal onto the wire by a water-based solution using a chemical catalyst for a metal cation reduction process. Generally the solution includes a salt containing the metal, a reducer, and a complexing agent to hold the metal in the solution, For electrical plating, the coating material 102 may be applied to the aluminum wire 101 by passing an electrical Current through metal ion containing solution. The aluminum wire 101 is a cathode in the bath, thereby attracting metal ions to the wire 101. The metal ions are deposited on the wire 101 creating a coating 102 on the wire 101. Once the metal coating 102 is deposited on the aluminum wire 101, the coated wire 103 is rinsed and dried.

The aluminum wire 101 can be coated with a suitable copper compatible metal such as either nickel or palladium. These materials, copper with aluminum, nickel Al—Ni wire or copper with aluminum, palladium, Al—Pd wire create reliable metallurgical systems. For instance, the intermetallic phase between the nickel and aluminum is less prone to Kirkendall voiding or galvanic corrosion. While these materials are reliable, the deposition of the metals 102 on the wire 101 is an important process because the addition of undesirable materials, such as phosphorous, which causes surface oxidation, can reduce the reliability of the system.

Figure 2:
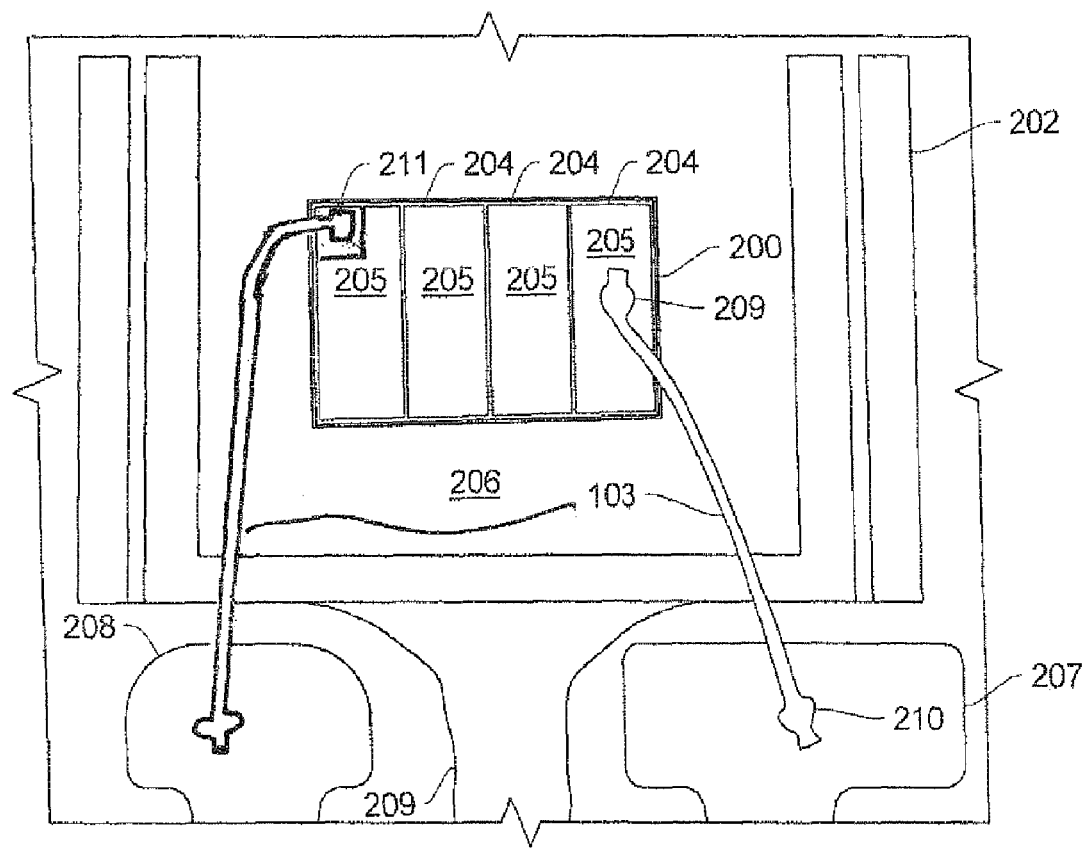
FIG. 2 is a top view of a semiconductor device partially wired to a Lead frame using the coated wire shown in FIG. 1.

Referring to FIG. 2, a semiconductor device 200 is die bonded to a lead frame 202 and has source regions 204 and a gate region 211 on one surface of the die 200 and a drain region (not shown in FIG. 2) on the opposing surface of the die 200. Also, the source regions 204 of the semiconductor die 200 have aluminum coatings 205. Further, the lead frame 202 is bare copper having a die attach pad 206, a source package lead 207, and a gate package lead 208. Also, the die attach pad 206 is connected to the lead frame using a tie bar 209, which connects the die attach pad 206 to cross ties that extend between the rails of the lead frame 202. The die 200 may be attached to the die attach pad 206 with solder paste.

Aluminum coated wires 103 are bonded to both the source region 204 and the gate region 211 and the respective copper source package lead 207 and copper gate package lead 208. The coated wire 103 is bonded using either an ultrasonic or thermosonic bonding method. The resulting bonds 209, 210, using either of these bonding methods, creates a wedge shape; thus termed a wedge bond. Ultrasonic wire bonding is a low temperature process that uses ultrasonic energy to create a wedge bond. Thermosonic wire bonding requires high temperatures and ultrasonic energy to create a bond between the wire and the material to which it is bonded.

The bonds between the semiconductor die 200 and the coated wire 103 are reliable because the die 200 has aluminum contacts and the wire 103 has an aluminum core coated with a suitable copper-compatible metal such as nickel or palladium. At one end, the aluminum core of the coated wire 103 creates a reliable bond with the aluminum contacts 204 on the die 200. At the other end of the bond wire, the copper-aluminum-nickel metallurgic system creates a reliable bond between the coated wire 103 and the package lead 207. The wire 103 is bonded to the bare copper package source lead 207 creating another wedge bond 210. Aluminum and copper are not as reliable as nickel or palladium and copper, and therefore copper lead frames are generally plated with nickel to ensure a reliable bond between the wire and the lead frame, However, the coated wire 103 provides a reliable bond also with a bare copper lead frame.

Nickel is often plated on bare copper lead frames, and aluminum wires are then used for electrically connecting a semiconductor die to the leads. While aluminum and nickel are reliable systems, plating bare copper lead frames with nickel can be quite costly. The invention provides one or more embodiments that are as reliable and less costly by using a nickel coating on an aluminum wire 103 because there is less surface area to cover, as between a wire and a lead frame. Thus, the same result is produced but at considerably less expense.

Figure 3:
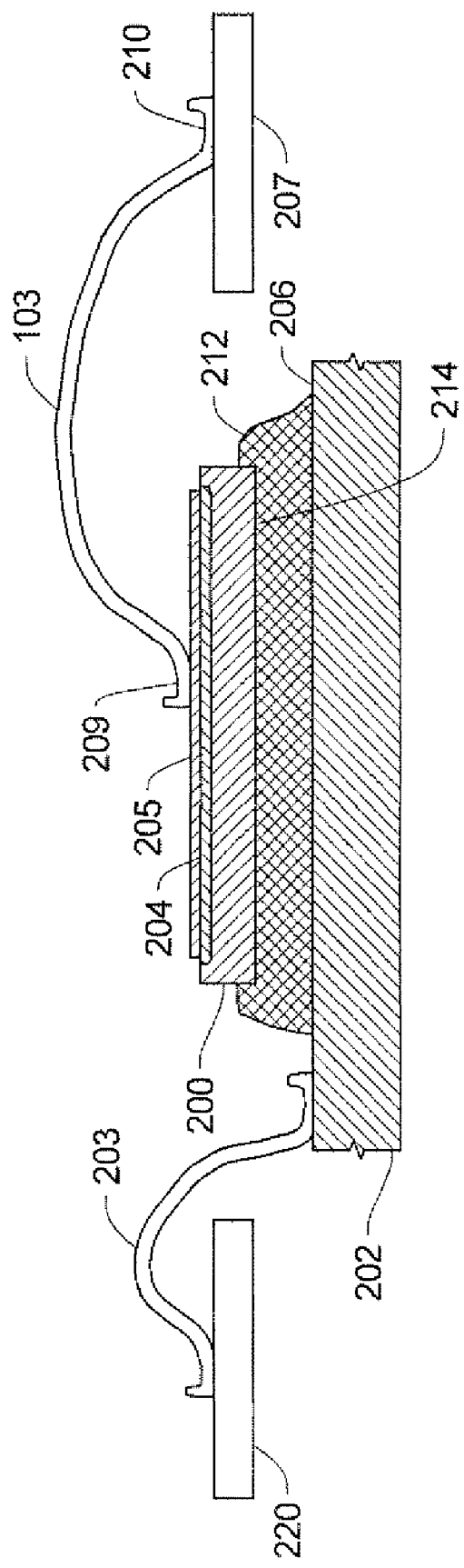
FIG. 3 is a sectional view of FIG. 2 with an additional package lead and coated wire.

FIG. 3 is a sectional view of the device shown in FIG. 2 with an added package lead 220 which is connected to the die attach pad 206 by another coated wire 203. The semiconductor die 200 is die bonded to the bare copper lead frame 202 such that the drain region 214 is attached to the die attach pad 206 by, for example, solder 212. The aluminum coated wire 103 is wedge bonded as shown in FIG. 3 to both the aluminum contact 205 of the source region 204 of the semiconductor die 200 and the bare copper package source lead 206. A similar aluminum coated wire is bonded between the aluminum contact on the gate region 211.

The method of manufacturing the device includes providing a bare copper lead frame with a die attach pad and a plurality of leads extending from parallel rails to the die pad and a semiconductor die. The semiconductor die is attached by its drain region to the die attach pad in the lead frame using solder paste. Thereafter, the coated wire is generally bonded to die pads on the semiconductor die first and then to the appropriate lead of the lead frame. Then the wire is cut; this process is called forward bonding. The wire may, however, be bonded first to the lead of a lead frame then to the die and cut. After the wire is bonded to the die and leads, the device is packaged and singulated.

Generally three types of wires are used in ultrasonic and thermosonic bonding methods. The common wires used in this type of wire bonding are copper, aluminum, and gold. These wires may be pure, but mostly are alloyed with other materials to provide strength in the wire. Generally copper and aluminum wires can be used in both ultrasonic or thermosonic bonding methods. Gold wires are generally used in thermosonic bonding methods.

Ultrasonic bonding produces a wedge shaped bond between the wire and substrate to which it is bonded. Ultrasonic bonding is a low temperature, low pressure bonding method that requires the use of ultrasonic energy in creating the bond. Specifically, the wire to be bonded to a surface or device is fed at an angle, generally 30-60° from the horizontal, into the wire bonding tool, called the wedge-shaped bonding tool. The wire is pinned against the first bonding site, and with pressure and ultrasonic energy the wire is bonded to the site. The bonding tool is raised and moved to the second bonding site, creating a loop shape in the wire from the first site to the second site. After the second bond is formed the wire is cut.

Thermosonic bonding is a high temperature, low pressure bonding process requiring ultrasonic energy. Again the wire is fed into the wedge shaped bonding tool at an angle. The wire is held to the first bonding site, either the semiconductor die or the source lead. The wire is pinned to the bonding site with pressure and heat along with ultrasonic energy to create a bond. The heat applied is generally in the range of 100-150° C., but in the case of gold wires can be as high as 250° C. The heat causes plastic deformation of the wire and the material to which it is bonded, creating an intermetallic connection.

The use of coated wires to electrically connect a semiconductor die to a lead at less cost may also be applied to other devices. A coated wire may also be used to connect electrical parts as shown in FIG. 3. For instance, two bare copper parts may be electrically connected by an aluminum wire coated with either palladium or nickel, since these combinations are reliable intermetallic connections.

While the preceding was explained in terms of a coated aluminum wire, other embodiments may include a gold wire coated with silver. Gold, silver, and copper create another reliable system that can perform under high temperatures. Thus, another embodiment of the present invention may include the use of a coated wire connecting a semiconductor die to a bare copper lead frame using a gold wire coated with silver or other suitable metallic materials.

The foregoing embodiments have been described in connection with a vertical MOSFET transistor. However those skilled in the art understand that other transistors and devices may be substituted. For example, bipolar transistor could be substituted for the MOSFET with emitter regions and contacts corresponding to the source regions and contacts, a base region and contact corresponding to the gate region and contacts, and a collector region and contact corresponding to the drain region and drain contact. Other semiconductor devices include and are not limited to integrated circuits, diodes, thyristors, or IGBTs.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

We claim:

1. A semiconductor device comprising:
    a semiconductor die having a surface with a control bonding pad of a first metal and a terminal bonding pad of the first metal formed on said surface;
    a lead frame comprising a second metal control lead and terminal leads; and
    a first bond wire comprising a core of the first metal with a coating comprising nickel, said first bond wire bonded at one end to the control bonding pad and at the other end to a control lead of the lead frame, and a second bond wire comprising a core of the first metal with a coating of nickel, said second bond wire bonded at one end to the terminal bonding pad and at the other end to a terminal lead of the lead frame;
    wherein the bonds of the bond wires to the bond pads forms a metallurgic bond of nickel and the first metal and the bond of the bond wires to the leads forms a metallurgical bond of nickel and the first and second metals.

2. The device of claim 1, wherein the first metal includes aluminum, or aluminum alloy and the second metal is copper.

3. The device of claim 1, wherein the semiconductor die is selected from the group consisting of a diode, a MOSFET, thyristor, integrated circuit, and IGBT.

4. The device of claim 1, wherein the semiconductor device further comprises a packaging material.

5. A semiconductor device comprising:
    a semiconductor die having aluminum bonding pads and a copper lead frame having multiple leads, each lead with a surface region of bare copper free from coatings of other metals; and
    elongated bond wires, each bond wire connected at one end to a bond pad and at the other end to a bare copper region of a lead, said bond wires having a core comprising aluminum and a coating of nickel for forming a nickel-aluminum bond on the bond pad and a nickel-aluminum-copper bond on the lead frame.

\* \* \* \* \*

UNITED STATES PATENT AND TRADEMARK OFFICE
CERTIFICATE OF CORRECTION

PATENT NO.         : 8,084,870 B2                                                                 Page 1 of 1
APPLICATION NO.    : 11/690908
DATED              : December 27, 2011
INVENTOR(S)        : Sangdo Lee et al.

It is certified that error appears in the above-identified patent and that said Letters Patent is hereby corrected as shown below:

Title Page, Item (75) Inventors, the second inventor information is incorrect. The second inventor should appear as: --Yongsuk Kwon, Jiangsu (CN)--.

Signed and Sealed this
Twenty-seventh Day of March, 2012

David J. Kappos
*Director of the United States Patent and Trademark Office*